US010976401B2

(12) United States Patent
Quellec et al.

(10) Patent No.: US 10,976,401 B2
(45) Date of Patent: Apr. 13, 2021

(54) METHOD FOR DETERMINING FEATURES OF AN ELECTROMAGNETIC WAVE

(71) Applicant: THALES, Courbevoie (FR)

(72) Inventors: Jean-Michel Quellec, Brest (FR); Daniel Christien, Brest (FR); Daniel Jahan, Brest (FR)

(73) Assignee: THALES, Courbevoie (FR)

( * ) Notice: Subject to any disclaimer, the term of this patent is extended or adjusted under 35 U.S.C. 154(b) by 362 days.

(21) Appl. No.: 15/764,121

(22) PCT Filed: Sep. 27, 2016

(86) PCT No.: PCT/EP2016/072941
§ 371 (c)(1),
(2) Date: Mar. 28, 2018

(87) PCT Pub. No.: WO2017/055257
PCT Pub. Date: Apr. 6, 2017

(65) Prior Publication Data
US 2018/0267088 A1 Sep. 20, 2018

(30) Foreign Application Priority Data
Sep. 29, 2015 (FR) ..................................... 15 02023

(51) Int. Cl.
*G01S 3/02* (2006.01)
*G01S 3/18* (2006.01)
(Continued)

(52) U.S. Cl.
CPC .............. *G01S 3/023* (2013.01); *G01S 3/043* (2013.01); *G01S 3/18* (2013.01); *G01S 3/28* (2013.01); *G01R 29/08* (2013.01)

(58) Field of Classification Search
CPC . G01S 3/023; G01S 3/043; G01S 3/18; G01S 3/30; G01S 5/0252–02529
See application file for complete search history.

(56) References Cited

U.S. PATENT DOCUMENTS 4,062,015 A * 12/1977 Litva .................... G01S 3/20
342/434
6,148,211 A * 11/2000 Reed ...................... H04W 64/00
455/456.2
(Continued)

FOREIGN PATENT DOCUMENTS

WO    WO-2010136409    12/2010

OTHER PUBLICATIONS

International Search Report for PCT/EP2016/072941, completed Dec. 7, 2016.
(Continued)

*Primary Examiner* — Cassi J Galt
(74) *Attorney, Agent, or Firm* — B. Aaron Schulman, Esq.; Stites & Harbison, PLLC

(57) ABSTRACT

The invention relates to a method for determining features of an electromagnetic wave received by a reception system (22), the reception system (22) comprising at least two reception channels (13), each reception channel (13) comprising an antenna (21) and a reception chain (14), each reception chain (14) being capable of delivering a value representative of the power delivered by the corresponding antenna (21) after reception of the wave by the reception system (22), the features comprising at least the direction of arrival of the received wave, the method comprising a step of providing a measurement vector,
the method further comprising the following steps:
comparing the measurement vector to calibration vectors, and
determining features of the received wave from the result of the comparison.

6 Claims, 3 Drawing Sheets

Figure 1:
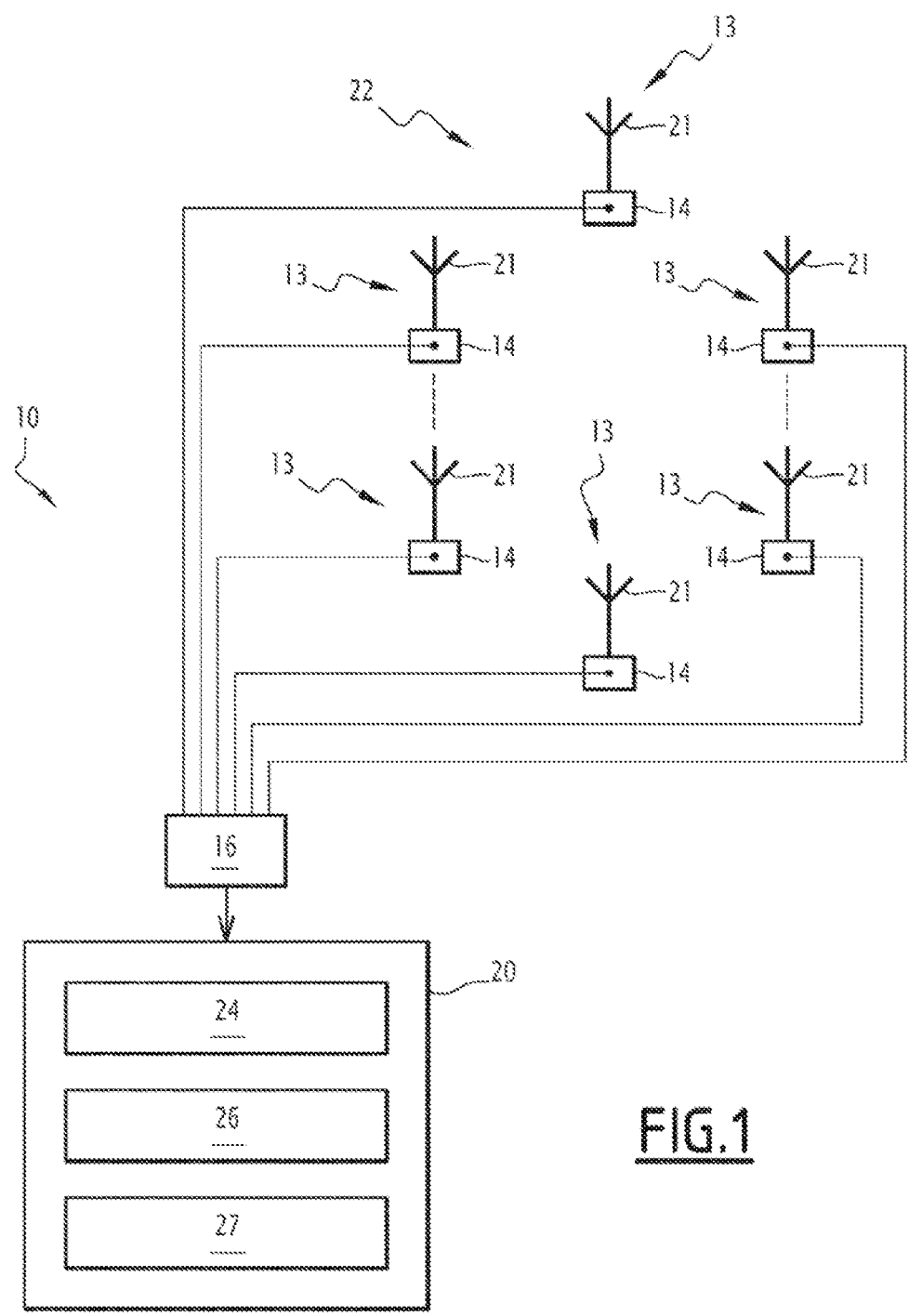

(51) Int. Cl.
*G01S 3/04* (2006.01)
*G01S 3/28* (2006.01)
*G01R 29/08* (2006.01)

(56) References Cited

U.S. PATENT DOCUMENTS

| | | | | |
|---|---|---|---|---|
| 7,313,403 | B2 * | 12/2007 | Gong | G01S 3/28 |
| | | | | 455/404.2 |
| 7,477,192 | B1 * | 1/2009 | Haff | G01S 3/30 |
| | | | | 342/374 |
| 7,948,438 | B1 * | 5/2011 | Francis | G01S 3/023 |
| | | | | 342/417 |
| 7,978,138 | B2 * | 7/2011 | Dusaitis | G01S 5/04 |
| | | | | 342/450 |
| 8,884,810 | B2 | 11/2014 | Perl et al. | |
| 2006/0087475 | A1 | 4/2006 | Struckman | |
| 2010/0090900 | A1 | 4/2010 | Mitsumoto | |
| 2012/0086605 | A1 | 4/2012 | Lecca et al. | |

OTHER PUBLICATIONS

Written Opinion of the International Searching Authority for PCT/EP2016/072941, dated Dec. 7, 2016.

\* cited by examiner

METHOD FOR DETERMINING FEATURES OF AN ELECTROMAGNETIC WAVE

The present invention relates to a method for determining features of an electromagnetic wave received by a reception system, the reception system comprising at least two reception channels, each reception channel comprising an antenna and a reception chain, each reception chain being capable of delivering a value representative of the power delivered by the corresponding antenna after reception of the wave by the reception system, the features comprising at least the direction of arrival of the received wave, the method comprising a step of providing a measurement vector having, as elements, the values representative of the power delivered by the antenna of each reception channel following the reception of the wave on the reception system.

In the field of electronic warfare, the detection and localization of sources of electromagnetic emissions are decisive steps in establishing a tactical situation or self-protection.

To localize such sources, the amplitude radiogoniometry technique is commonly used. Amplitude radiogoniometry consists of determining the direction of arrival of a wave received by an array of antennas, from powers delivered by each of the antennas illuminated by the wave. The direction of arrival of a wave is the direction in which the source from which the wave was emitted is located. The antenna array comprises directional antennas, generally oriented relative to one another so as to completely cover the angular field to be monitored.

To improve the precision of the direction of arrival values obtained by amplitude radiogoniometry, it is known to increase the number of antennas of the antenna array.

However, due to the complexity of the hardware, and therefore the cost, the number of antennas in an antenna array is generally limited to six or eight antennas.

One additional technique for improving the precision of the direction of arrival values obtained by amplitude radiogoniometry consists in calibrating the power delivered by each antenna as a function of the frequency of the received wave.

However, the precision of the obtained direction of arrival values may still be improved.

One aim of the invention is to improve the precision in determining the direction of arrival of an electromagnetic wave received by an array of antennas having a fixed number of antennas.

To that end, the invention relates to a determination method of the aforementioned type, wherein the method further comprises the following steps:

comparing the measurement vector to calibration vectors, the calibration vectors being contained in calibration tables formed from the emission, on the reception system, of electromagnetic waves each having a set of known features, each emission making it possible to obtain a calibration vector, each calibration vector having, as elements, values representative of the power delivered by the antenna of each reception channel as a function of a set of known features, and determining features of the wave received on the reception system from the result of the comparison.

According to specific embodiments, the determination method comprises one or more of the following features, considered alone or according to any technically possible combinations:

for each received wave, the set of known features comprises one or several features chosen from among a radiated power value, a frequency value, a direction of arrival value and a polarization value.

each calibration vector is a function of a frequency value contained in the calibration tables, the method comprising a step for providing the frequency of the wave received by the reception system and determining the frequency, from among the frequencies of the calibration tables, closest to the provided frequency, the method further comprising a step for selecting calibration vectors having, as elements, the values representative of delivered power as a function of the determined frequency.

each calibration vector is a function of a direction of arrival value contained in the calibration tables, the method comprising a step for estimating the rough direction of arrival of the wave received by the reception system to obtain at least one rough direction of arrival value, the method further comprising a step for selecting calibration vectors having, as elements, the values representative of delivered power as a function of direction of arrival values comprised broadly speaking in a direction of arrival interval centered around the rough direction of arrival.

each calibration vector is a function of a radiated power value contained in the calibration tables, the method comprising a step for estimating the rough radiated power of the wave received by the reception system, the method further comprising a step for selecting calibration vectors having, as elements, the values representative of delivered power as a function of radiated power values comprised broadly speaking in a radiated power interval centered around the rough radiated power.

the comparison step comprises calculating distances between the measurement vector and calibration vectors of the calibration tables, the features of the wave determined during the determination step being the features of the calibration vector for which the calculated distance is minimal.

the method further comprises a step for comparing the calculated minimum distance to a distance threshold and invalidating determined features when the calculated minimum distance is strictly greater than the distance threshold.

the method also comprises a step for providing a confidence interval for at least one of the determined features, the confidence interval of the determined feature(s) having, as boundaries, the extreme values of the feature from among the values of the feature associated with calculated distances comprised in a distance interval, the distance interval having, as lower boundary, the calculated minimum distance and, as upper boundary, the calculated minimum distance plus a tolerance.

each calibration vector of the calibration tables is associated with a number of occurrences representative of the number of times where the calibration vector is obtained for a same set of known features, the comparison step comprising a phase for searching, in the calibration tables, for calibration vectors equal to the measurement vector with a predetermined tolerance, the features of the wave, determined during the determination step, being the features of the calibration vector for which the number of occurrences is maximal from among the calibration vectors obtained during this search phase.

when one or several calibration vectors are obtained following the search phase, the method also comprises a step for providing a confidence interval for at least one of the determined features, the confidence interval of the determined feature(s) having, as boundaries, the extreme values of the feature from among the values of the feature associated with the calibration vectors obtained during the search phase.

The invention also relates to a device for determining features of an electromagnetic wave received by a reception system, the reception system comprising at least two reception channels, each reception channel comprising an antenna and a reception chain, each reception chain being capable of delivering a value representative of the power delivered by the corresponding antenna after reception of the wave by the reception system, the features comprising at least the direction of arrival of the received wave, the device being able to carry out the steps of the method as previously described.

Figure 2:
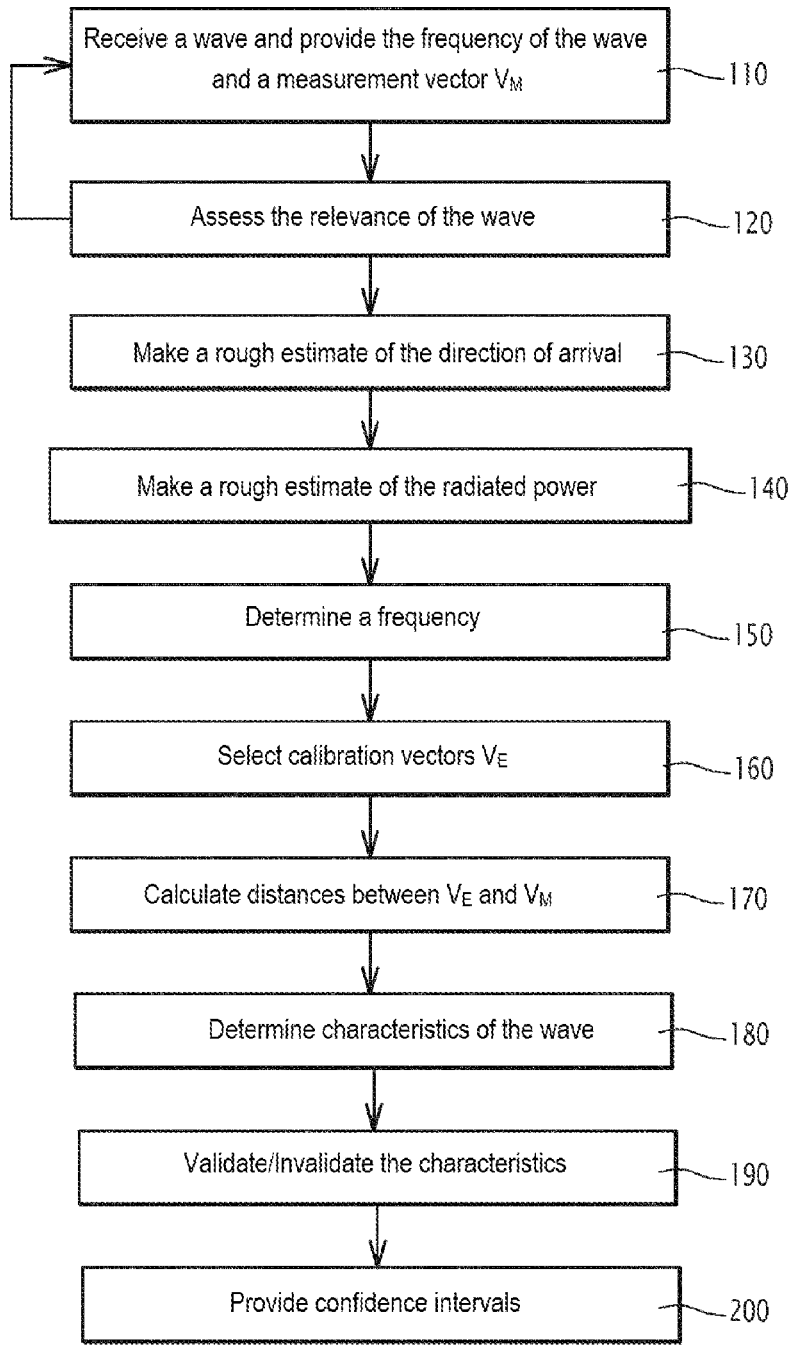
Figure 3:
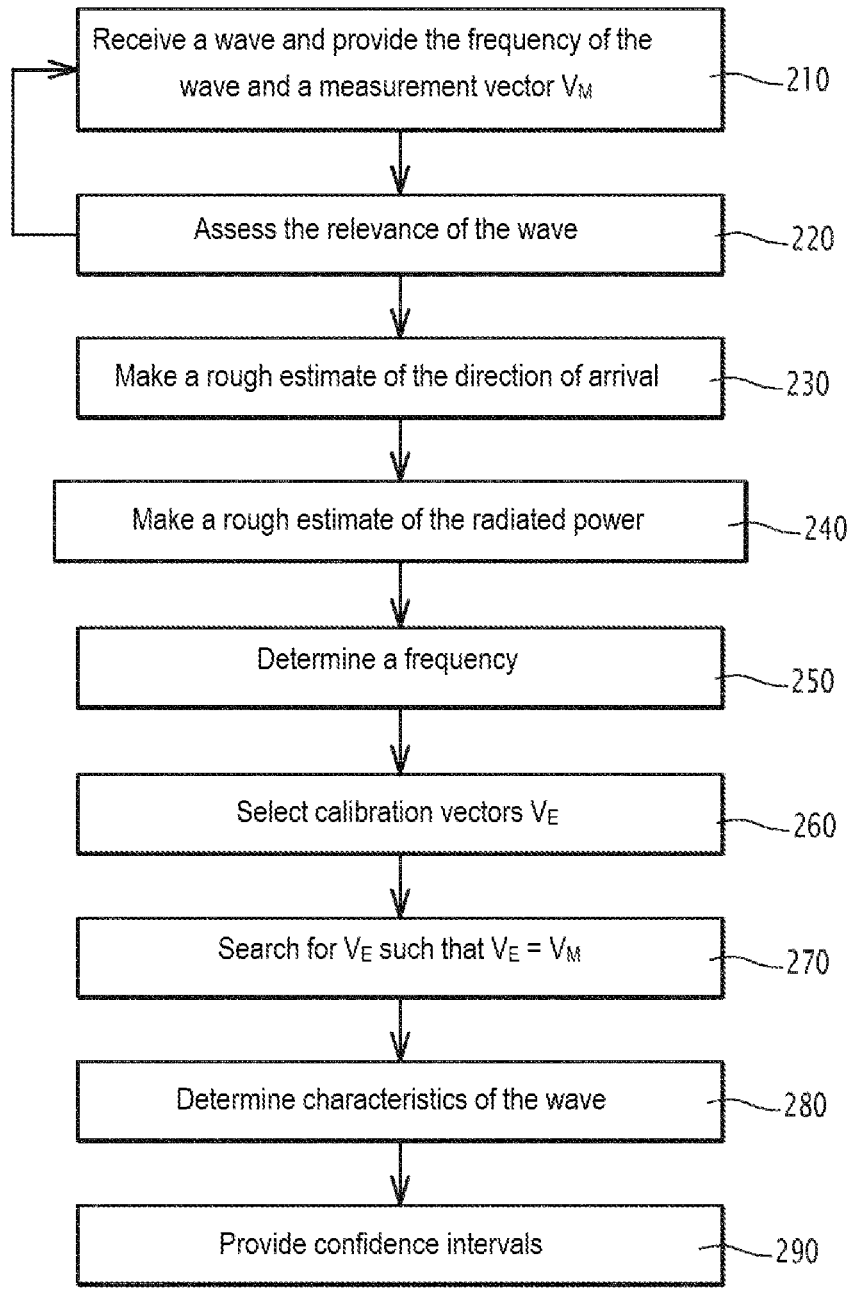

Other features and advantages of the invention will appear upon reading the following description of embodiments of the invention, solely as an example and done in reference to the drawings, which are:

FIG. 1, a schematic view of an example of a device for determining features of an electromagnetic wave, FIG. 2, a flowchart of a first example embodiment of a method for determining features of an electromagnetic wave, and FIG. 3, a flowchart of a second example embodiment of a method for determining features of an electromagnetic wave.

A device 10 for determining features of an electromagnetic wave is illustrated by FIG. 1. The features of the wave to be determined are the frequency, the radiated power, the direction of arrival and the polarization of the wave. The radiated power is the power brought before an array of antennas; it is an EIRP, or effective isotropic radiated power.

The device 10 comprises a reception system 22 formed by at least two reception channels 13, a trigger 16 and a processing unit 20.

In the embodiment illustrated by FIG. 1, the device 10 comprises six reception channels 13.

Each reception channel 13 comprises an antenna 21 capable of receiving electromagnetic waves and a reception chain 14 for the waves received on the antenna 21.

The antennas 21 are directional antennas, i.e., they are capable of receiving electromagnetic waves in a favored direction.

The usage frequency of the antennas 21 is for example comprised between 2 Gigahertz (GHz) and 18 GHz.

The antennas 21 of the reception channels 13 are oriented relative to one another so as to provide complete coverage of the angular domain to be monitored. For example, in the embodiment illustrated by FIG. 1, the six antennas 21 of the reception channels 13 are oriented relative to one another with a regular angular offset of 60 degrees) (°) so as to cover 360° of the angular domain to be monitored.

Alternatively, the antennas 21 are oriented relative to one another so as to cover a portion smaller than 360° of an angular domain.

The power delivered by each antenna 21 corresponds to the power of the incident wave on the antenna 21 multiplied by the gain of the antenna. The gain of the antenna depends on the pointing direction of the antenna and the direction of arrival of the incident wave.

Each reception chain 14 is configured to process the signals delivered by the corresponding antenna 21 when the latter is illuminated by an electromagnetic wave and thus to provide a value representative of the power delivered by the corresponding antenna 21. The processing operations primarily consist of amplifying the signals to bring them to an operating power and, in fine, providing a value of their power, for example numerical.

In the continuation of the description, each representative value of the power delivered by an antenna 21 is called measured power value and is denoted $y_{M,n}$, with n the index of the reception channel, n varying from 1 to 6 for the example illustrated by FIG. 1. The measured power values $y_{M,n}$ of the reception channels 13 are the components of a measurement vector denoted $V_M$ and expressed in the form of the following function (1):

$$V_M = \{y_{M,n}\}_{n=1,\ldots,N} \tag{1}$$

Furthermore, the reception chains 14 are also configured to make it possible to measure the frequency of the incident wave.

The trigger 16 is able to receive the measured power value $y_{M,n}$ at the output of each reception channel 13.

The trigger 16 is able to compare the measured power values $y_{M,n}$ of each reception chain 13 to a detection threshold.

The detection threshold is in particular chosen as a function of the signal-to-noise ratio required by the detection.

The processing unit 20 comprises a processor 24, a memory 26 and a rapid digital processing system 27.

The calibration tables of the reception channels 13 of the device 10 are stored in the memory 26.

The calibration tables comprise, for each reception channel 13, values representative of the power delivered by the antenna 21 of the reception channel 13, as a function of radiated power values, frequency values, direction of arrival values and polarization values. The polarization values are for example the vertical polarization and the horizontal polarization. The values contained in the calibration tables being obtained by measurements, they are therefore discrete values.

In the rest of the description, the values representative of the power delivered by the antenna 21 of each reception channel 13 and in the memory of the calibration tables are called calibrated power values. Such calibrated power values are denoted $y_{0,n}$ with n the index of the reception channel, n varying from 1 to 6 for the example illustrated by FIG. 1.

Such calibrated power values $y_{0,n}$ are for example expressed in the form of the following function (2):

$$y_{0,n} = y_{0,n}(\theta_i, PR_j, f_k, pol_l) \tag{2}$$

where n designates a given reception channel, n varying from 1 to N, $y_{0,n}$ designates a calibrated power value obtained at the output of the reception channel n, $\theta_i$ designates a given direction of arrival of a wave received by the reception system 22, i varying from 1 to I, $PR_j$ designates a given radiated power of a wave received by the reception system 22, j varying from 1 to J, $f_k$ designates a given frequency of a wave received by the reception system 22, k varying from 1 to K, and $pol_l$ designates a given polarization of a wave received by the reception system 22, l varying from 1 to L.

The calibration tables are formed from the emission, on the reception system 22, of electromagnetic waves each having a set of known features. The set of known features for each wave forms a quadruplet of features comprising the radiated power of the received wave, the frequency of the received wave, the polarization of the received wave and the direction of arrival of the received wave.

Each emission makes it possible to obtain a calibration vector $V_E$ having, as elements, the calibrated power values $y_{0,n}$ obtained for each reception channel 13 following the emission. The calibration vectors $V_E$ are expressed in the form of the following function (3):

$$V_E = \{y_{0,n}(\theta_i, PR_j, f_k, pol_l)\}_{n=1,\ldots,N} \quad (3)$$

where the notations are those of function (2).

The set of calibration tables forms a solution space. The features of the incident wave on the reception system 22 are sought in such a solution space.

The rapid digital processing system 27 for example incorporates components such as programmable logic circuits (FPGA) integrating firmware. A firmware, also called microsoftware or microcode, is a set of instructions and data structures.

Such components are configured to carry out steps 130 to 200 of the flowchart illustrated in FIG. 2 and which will be described in more detail in the description below.

The operation of the device 10 according to the first embodiment is now described in reference to FIG. 2, which schematically illustrates a first example embodiment of a method for determining features of an electromagnetic wave.

Initially, the determination method comprises a step 110 for receiving an electromagnetic wave on the reception system 22.

Each reception channel 13 then provides a measured power value $y_{M,n}$, the set of measured power values $y_{M,n}$ forming the components of the measurement vector $V_M$.

The reception channels 13 also make it possible to measure the frequency of the wave received on the reception system 22.

Then, the determination method comprises a step 120 for the evaluation, by the trigger 16, of the relevance of the received wave.

To that end, each measured power value $y_{M,n}$ is compared to the detection threshold.

When at least one measured power value $y_{M,n}$ is greater than or equal to the detection threshold, the following steps of the method are carried out:

Otherwise, the measured power values $y_{M,n}$ are considered to be too small and the following steps of the method are not carried out.

Hereinafter, the following steps 130 to 200 of the method are carried out by the rapid digital processing system 27.

The determination method next comprises a step 130 for estimating the rough direction of arrival of the incident wave on the reception system 22.

The rough direction of arrival is estimated from measured power values $y_{M,n}$ and an algorithm typically used in the field of amplitude radiogoniometry.

The determination method also comprises a step 140 for estimating the rough radiated power of the incident wave on the reception system 22.

The rough radiated power of the incident wave is estimated from the maximum of the measured power values $y_{M,n}$.

The determination method also comprises a step 150 for determining, in the calibration tables, the discrete frequency value closest to the measured frequency value. Such a determined frequency value is called determined frequency value. The determined frequency value is used to reduce the solution space. Conversely, the frequency of the received wave is considered to be the frequency obtained at the output of the reception channels 13.

The determination method then comprises a step 160 for selecting calibration vectors $V_E$ in the calibration tables. The selection step 160 consists of reducing the solution space formed by the calibration tables.

Thus, in the continuation of the method, only the selected calibration vectors $V_E$ are considered. The selected calibration vectors $V_E$ are the calibration vectors $V_E$ depending on: the determined frequency value, a radiated power value comprised, broadly speaking, in a radiated power interval centered around the estimated rough radiated power and a direction of arrival value comprised, broadly speaking, in a direction of arrival interval centered around the estimated rough direction of arrival. The direction of arrival interval is for example centered at ±5° around the rough direction of arrival.

The determination method next comprises a step 170 for calculating the distance $\Delta$ between the measurement vector $V_M$ and each calibration vector $V_E$ of the reduced solution space. The calculated distance $\Delta$ is for example the Euclidean distance, given by the following equation (4):

$$\Delta = \sqrt{\sum_{n=1}^{N}(y_{M,n} - y_{0,n}(\theta_i, PR_j, f_k, pol_l))^2} \quad (4)$$

where the notations are those of function (2).

The determining method next comprises a step 180 for determining features of the incident wave. The features of the incident wave are the features of the calibration vector $V_E$ for which the calculated distance $\Delta$ is minimal and equal to $\Delta_0$.

Then, the determination method comprises a step 190 for comparing the minimum distance $\Delta_0$ to a distance threshold.

When the minimum distance $\Delta_0$ is less than or equal to the distance threshold, the features determined during the determining step 180 are validated and deemed likely.

Conversely, when the minimum distance $\Delta_0$ is strictly greater than the distance threshold, the features determined during the determining step 180 are invalidated and deemed unlikely. In this case, the incident wave on the reception system 22 probably comes from a mixture of signals for example coming from stray reflections of the wave on a structure close to the reception system 22.

The determination method also comprises a step 200 for providing a confidence interval for at least one of the determined features.

To that end, a tolerance is added to the minimum distance $\Delta_0$ so as to define a distance interval having, as lower boundary, the minimum distance $\Delta_0$ and, as upper boundary, the minimum distance $\Delta_0$ plus the tolerance.

The confidence interval on the radiated power of the incident wave has, as lower boundary, the minimum radiated power from among the radiated power values associated with the distances $\Delta$ comprised in the distance interval and, as upper boundary, the maximum radiated power from among the radiated power values associated with the distances $\Delta$ comprised in the distance interval.

Likewise, the confidence interval on the direction of arrival of the incident wave has, as lower boundary, the minimum direction of arrival from among the direction of arrival values associated with the distances $\Delta$ comprised in the distance interval and, as upper boundary, the maximum direction of arrival from among the direction of arrival values associated with the distances $\Delta$ comprised in the distance interval.

In the case of the polarization, the most likely polarization is the most frequent polarization from among the polarizations associated with the distances $\Delta$ comprised in the distance interval.

Thus, the described method implements digital processing, associated with a goniometry system with several antennas, making it possible to estimate the direction of arrival, the radiated power and the polarization that are most likely for an initially unknown wave.

The precision of the determined direction of arrival is improved due to the use of calibration tables taking account of the variations of the power output from each reception channel 13 as a function of direction of arrival, frequency, radiated power and polarization values.

Furthermore, such a method also allows a precise determination of the radiated power of the incident wave and a determination of the most likely polarization trend.

The selection of calibration vectors $V_E$ from among the set of calibration vectors $V_E$ makes it possible to reduce the solution space formed by the calibration tables. This thereby makes it possible to decrease the calculation times by considering only the most likely features of the solution space.

The validation or invalidation of the features determined by comparing the minimum distance $\Delta_0$ to a distance threshold makes it possible to dismiss the incident waves coming from the superposition of several signals, and in particular stray reflections.

Furthermore, providing a confidence interval for the determined power and direction of arrival values makes it possible to assess the reliability of the determined features.

According to a second embodiment of the device 10, the elements identical to the elements of the device 10 of the first embodiment are not repeated. Only the differences are shown.

In this second embodiment, the calibration tables stored in the memory 26 have been formed from the emission, repeated P times on the reception system 22, of electromagnetic waves each having a same quadruplet of known features. The quadruplet of known features for each wave comprises the radiated power of the received wave, the frequency of the received wave, the polarization of the received wave and the direction of arrival of the received wave.

Each new reception of a wave with the same quadruplet of known features forms a draft. Each draft corresponds to thermal noise and calibration noise values that are potentially different from one draft to another.

For each quadruplet of known features, at the end of the set of P drafts, a number P of calibration vectors $V_E$ is obtained having, as elements, the calibrated power values $y_{0,n}$ at the output of each reception channel 13.

Among the calibration vectors $V_E$ obtained for a same quadruplet, some being likely to be equal, the number Q of different calibration vectors $V_E$ for a same quadruplet of known features is less than or equal to the number P of drafts.

Each calibration vector $V_E$ is then associated with a number of occurrences $h_q$, q varying from 1 to Q, representative of the number of times where the calibration vector $V_E$ is obtained for each quadruplet of known features. For each quadruplet of known features, the calibration vectors $V_E$ are for example expressed in the form of the following function (5):

$$V_E = \{\{\{y_{0,n}\}_q, h_q\}_{n=1,\ldots,N}\}_{q=1,\ldots,Q} \quad (5)$$

As a result, the calibration tables comprise, for each quadruplet of known features, a representative histogram of the occurrence of each obtained calibration vector $V_E$. The histograms are for example expressed in the form of the following function (6):

$$H = \{\{\{y_{0,n}\}_q, h_q\}_{n=1,\ldots,N}(\theta_i, PR_j, f_k, pol_l)\}_{q=1,\ldots,Q} \quad (6)$$

where the notations are those of function (2).

The components of the rapid digital processing system 27 are configured to carry out steps 230 to 290 of the flowchart illustrated in FIG. 3 and which will be described in more detail in the description below.

The operation of the device 10 according to the second embodiment will now be described.

The determination method according to the second embodiment comprises reception 210, evaluation 220, rough direction of arrival estimation 230, rough radiated power determination 240, frequency determination 250 and selection 260 steps that are respectively identical to the reception 110, evaluation 120, rough direction of arrival estimation 130, rough radiated power estimation 140, frequency determination 150 and selection 160 steps of the determination method according to the first embodiment.

The determination method further comprises a step 270 for searching in the calibration tables for calibration vectors $V_E$ equal to the measurement vector $V_M$. Two vectors are considered to be equal when the components of these vectors are equal with a predetermined tolerance.

Next, the method comprises a step 280 for determining features of the incident wave from calibration vectors $V_E$ obtained during the search step 270.

When no calibration vector $V_E$ is equal to the measurement vector $V_M$, it is not possible to determine the features of the incident wave from calibration tables. This indicates that the incident wave probably results from the superposition of signals, and in particular stray reflections.

When one or several calibration vectors $V_E$ are equal to the measurement vector $V_M$, the features of the incident wave are the features of the calibration vector $V_E$ for which the number of occurrences $h_q$ is maximal.

In this case, the determination method comprises a step 290 for providing a confidence interval for at least one of the estimated features.

The confidence interval for the radiated powers has, as boundaries, the extreme radiated power values from among the radiated powers associated with the calibration vectors $V_E$ obtained at the end of the search step 270.

Likewise, the confidence interval for the directions of arrival has, as boundaries, the extreme direction of arrival values from among the directions of arrival associated with the calibration vectors $V_E$ obtained at the end of the search step 270.

Each confidence interval is assigned an occurrence index relative to the likelihood of obtaining the calibration vector $V_E$ irrespective of the quadruplet of features associated with the calibration vector $V_E$. The occurrence index is calculated from the number of occurrences $h_q$ of the calibration vectors $V_E$ obtained at the end of the search step 270.

The most likely polarization is the most frequent polarization from among the polarizations associated with the calibration vectors $V_E$ obtained at the end of the search step 270.

Aside from the advantages described for the first embodiment, the second embodiment makes it possible, by carrying out several drafts, to account for the variations due to the additive thermal noises in each reception channel 13 and the residual calibration errors. This thereby improves the precision in the determination of features of the incident wave.

The invention claimed is:

1. A method for determining features of an electromagnetic wave received by a reception system, the reception system comprising at least two reception channels and a processing unit, each reception channel comprising an antenna and a reception chain, each reception chain being capable of delivering a value representative of the power delivered by the corresponding antenna after reception of the wave by the reception system, the features comprising at least the direction of arrival of the received wave, the method implemented by the reception system and comprising:

receiving an electromagnetic wave on the reception system, providing a measurement vector having, as elements, the values representative of the power delivered by the antenna of each reception channel following the reception of the wave on the reception system, comparing the measurement vector to calibration vectors, the calibration vectors being contained in calibration tables formed from the emission, on the reception system, of electromagnetic waves each having a set of known features, each emission making it possible to obtain a calibration vector, each calibration vector having, as elements, values representative of the power delivered by the antenna of each reception channel as a function of the set of known features, and determining features of the wave received on the reception system from the result of the comparison, wherein each calibration vector is a function of a direction of arrival value contained in the calibration tables, the method further comprising estimating a rough direction of arrival of the wave received by the reception system to obtain at least one rough direction of arrival value, selecting calibration vectors having, as elements, the values representative of delivered power as a function of direction of arrival values in a direction of an arrival interval centered around the rough direction of arrival, wherein each calibration vector of the calibration tables is associated with a number of occurrences representative of the number of times where the calibration vector is obtained for a same set of known features, the comparing comprising a phase for searching, in the selected calibration vectors, for calibration vectors equal to the measurement vector within a predetermined tolerance, the determined features of the wave being the features of a calibration vector for which the number of occurrences is maximal from among the calibration vectors obtained during said phase for searching; and wherein the calibration vectors contained in the calibration table are formed by the emission, repeated a predetermined number of times, on the reception system, of the electromagnetic waves each having a set of known features, the predetermined number of times being greater than one, each new reception of a wave having the same known features forming a draft, each draft corresponding to thermal noise and calibration noise values potentially different from one draft to another.

2. The method according to claim 1, wherein, for each received wave, the set of known features comprises direction of arrival value and a feature selected from the group consisting of a radiated power value, a frequency value, a polarization value, and combinations thereof.

3. The method according to claim 1, wherein each calibration vector is a function of a frequency value contained in the calibration tables, the method further comprising providing the frequency of the wave received by the reception system and determining the frequency, from the frequencies of the calibration tables, closest to the provided frequency, and selecting calibration vectors having, as elements, the values representative of delivered power as a function of the determined frequency.

4. The method according to claim 1, wherein each calibration vector is a function of a radiated power value contained in the calibration tables, the method further comprising estimating the rough radiated power of the wave received by the reception system, and selecting calibration vectors having, as elements, the values representative of delivered power as a function of radiated power values in a radiated power interval centered around the rough radiated power.

5. The method according to claim 1, wherein when several calibration vectors are obtained following the search phase, the method further comprises providing a confidence interval for at least one of the determined features, the confidence interval of the determined feature(s) having, as boundaries, extreme values of the feature associated with the calibration vectors obtained during the search phase.

6. A device for determining features of an electromagnetic wave received by a reception system, comprising a reception system comprising at least two reception channels, each reception channel comprising an antenna and a reception chain, each reception chain being capable of delivering a value representative of the power delivered by the corresponding antenna after reception of the wave by the reception system, the features comprising at least the direction of arrival of the received wave, wherein the device is able to carry out the method according to claim 1.

* * * * *